United States Patent [19]

Roberts, Jr.

[11] Patent Number: 5,026,667
[45] Date of Patent: Jun. 25, 1991

[54] PRODUCING INTEGRATED CIRCUIT CHIPS WITH REDUCED STRESS EFFECTS

[75] Inventor: Carl M. Roberts, Jr., Topsfield, Mass.

[73] Assignee: Analog Devices, Incorporated, Norwood, Mass.

[21] Appl. No.: 423,356

[22] Filed: Oct. 18, 1989

Related U.S. Application Data

[63] Continuation of Ser. No. 139,480, Dec. 29, 1987, abandoned.

[51] Int. Cl.$^5$ ..................... H01L 21/60; H01L 21/56
[52] U.S. Cl. ................... 437/209; 437/211; 437/219; 437/231; 437/227
[58] Field of Search ............... 437/209, 211, 212, 216, 437/219, 220, 227, 229, 231, 235, 238, 243; 357/71, 72, 73; 29/855; 264/272.11

[56] References Cited

U.S. PATENT DOCUMENTS

| 706,840 | 12/1872 | Moyle | 437/219 |
|---|---|---|---|
| 3,447,975 | 6/1969 | Bilo et al. | 437/235 |
| 3,478,420 | 11/1969 | Grimes et al. | 437/211 |
| 3,496,631 | 2/1970 | Chen | 437/205 |
| 3,584,264 | 6/1971 | McLouski et al. | 437/213 |
| 3,610,870 | 10/1971 | Sakamoto | 437/224 |
| 3,615,913 | 10/1971 | Shaw | 437/211 |
| 3,708,870 | 1/1973 | Goodman | 437/141 |
| 3,762,039 | 10/1973 | Douglass et al. | 437/220 |
| 3,788,895 | 1/1974 | Schimmer et al. | 437/235 |
| 3,903,590 | 9/1975 | Yokogawa | 437/209 |
| 3,978,578 | 9/1976 | Murphy | 437/211 |
| 4,001,870 | 1/1977 | Saiki et al. | 437/238 |
| 4,040,874 | 8/1977 | Yerman | 437/219 |
| 4,173,683 | 11/1979 | Comizzoli | 437/219 |
| 4,263,792 | 5/1980 | Thompson | 437/220 |
| 4,327,369 | 4/1982 | Kaplan | 437/211 |
| 4,511,705 | 4/1985 | Makino et al. | 437/211 |
| 4,558,510 | 12/1985 | Tani | 437/209 |
| 4,586,997 | 5/1986 | Lee | 437/219 |
| 4,633,573 | 1/1987 | Scherer | 437/209 |
| 4,663,190 | 5/1987 | Fujita et al. | 437/211 |
| 4,709,468 | 12/1987 | Wilson | 437/209 |
| 4,759,874 | 7/1988 | Gros | 156/307.3 |
| 4,769,344 | 9/1988 | Sakai et al. | 437/211 |
| 4,857,483 | 8/1989 | Steffen et al. | 437/209 |
| 4,859,632 | 8/1989 | Lumbard | 437/220 |

FOREIGN PATENT DOCUMENTS

| 0162352 | 10/1982 | Japan | 437/219 |
|---|---|---|---|
| 0053060 | 3/1985 | Japan | 437/211 |

Primary Examiner—Olik Chaudhuri
Assistant Examiner—M. Wilczweski
Attorney, Agent, or Firm—Parmelee, Bollinger & Brambeltt

[57] ABSTRACT

Wire-bonded IC chips are coated with siloxane polyimide and cured to a hardened state. The coating is applied over portions of the circuitry which are stress-sensitive. The coating is spaced away from the wire-bond regions of the chip. Thereafter, the coated chip is plastic encapsulated in conventional fashion.

10 Claims, 2 Drawing Sheets

PRODUCING INTEGRATED CIRCUIT CHIPS WITH REDUCED STRESS EFFECTS

This application is a continuation of application Ser. No. 139,480 as originally filed on Dec. 27, 1987 now abandoned.

BACKGROUND OF THE INVENTION

1. Field of the Invention

This invention relates to integrated circuit (IC) chips packaged in plastic encapsulating material. More particularly, this invention relates to precision linear IC chips in plastic packages arranged to provide enhanced manufacturing yields and increased reliability in operation.

2. Description of the Prior Art

IC chips are packaged in various ways depending upon the type of chip and its intended application. One of the least expensive packaging techniques is that of completely encapsulating the chip with plastic in a mechanized high-volume molding operation. Such plastic packaging is used extensively for many types of chips. However, it has not found significant usage for precision linear IC chips, because such chips could not with known plastic packaging techniques provide a high manufacturing yield or perform reliably in the field. Thus, conventionally, precision linear chips have been packaged in hermetically sealed packages, e.g. formed of ceramic, at a higher unit cost than plastic packaging. Thus, attention has been directed for some time to solving the problem of packaging precision linear ICs in plastic.

It has been proposed in the art to apply a so-called overcoat to the surface of an IC chip prior to its being packaged in plastic, for the purpose of reducing penetration of moisture to the chip surface and thereby to prevent corrosion. However, experience with such an overcoat application has shown serious problems such as breakage of wires bonded to the contact pads.

Considerable research has recently been directed to analysis of forces produced by a molded plastic package on the surface of the contained IC chip, to determine such matters as the resulting displacement of aluminum interconnects with changes in temperature of the plastic encapsulation or the piezo-resistivity effects on diffused or implanted resistors. Some published studies, for example, have concerned the use of test structures to make quantitative measurements of compressive stresses and qualitative observations of shear stress effects. None of this work on force analysis has, however, led to insights into ways of significantly improving the manufacturing yields and performance of plastic encapsulated precision linear IC chips.

Accordingly, there has existed a long felt need to achieve the capability of assembling precision linear devices in plastic packages, with both high graded yields and reliable performance in use. It is a principal purpose of this invention to solve that problem.

SUMMARY OF THE INVENTION

Plastic encapsulation has not worked well with precision linear circuits because the plastic compound (typically a thermo-setting plastic) applies to the chip compressive piezo (squeezing) stresses capable of altering unacceptably the electrical performance of the circuits. Such stresses tend to vary, e.g. with time, or with external conditions such as temperature. The stress variations cause stress-sensitive portions of the IC circuitry to change their characteristics so as to alter circuit signal levels to beyond desired limits. For example, specifications for certain types of precision linear IC chips require that the measured offset voltage ($V_{OS}$) stay within close tolerances under stipulated conditions, but such tolerances cannot reliably be maintained using conventional plastic packaging techniques. The present invention is directed to avoiding stress effects on chips packaged in plastic.

In a presently preferred embodiment of the invention, to be described hereinbelow in detail, the IC chip first is formed in conventional fashion with an integrated circuit including the usual electrical contact pads. The chip then proceeds through conventional wire-bonding, where very fine wires are bonded to the contact pads and are connected to external leads forming part of the usual lead frame.

Following wire-bonding, a coating of flowable insulating material is applied over preselected stress-sensitive portions of the integrated circuit. The insulating material is maintained clear of (i.e. spaced away from) the wire-bond regions of the chip, including the wires and the ball bonds. The coating of insulating material thereafter is caused to harden in close intimate contact with the integrated circuit, as a protective coating for the selected circuit portions to which it has been applied. Thereafter, the coated chip is plastic encapsulated in conventional fashion.

The resulting IC chips have been found to have a greatly increased yield to grade, relative to non-coated chips. Also, performance under test conditions is much improved. A particularly remarkable result for certain types of integrated circuits is a much narrower distribution pattern for test measurements made on the chips. Thus it becomes possible to reduce the specification tolerances significantly in certain instances, while still achieving high yields in the tighter specification grades.

By applying the coating only to selected portions of the chip surface, and especially by avoiding contact between the coating and the wire-bonds and the wires attached to the chip, difficulties with wire breakage and the like have been avoided.

Accordingly, it is an object of the invention to provide improved techniques for packaging precision linear IC chips in plastic, and to produce superior plastic packaged IC chips made by such techniques. A more specific object of the invention is to produce plastic encapsulated IC chips which have a high yield to grade, and more reliable performance in use. Other objects, aspects and advantages of the invention will in part be pointed out in, and in part apparent from, the following description of preferred embodiments of the invention considered together with the accompanying drawings.

DETAILED DESCRIPTION OF THE PREFERRED EMBODIMENTS

A basic aspect of the invention comprises the application to stress-sensitive portions of an IC chip of a protective coating capable of isolating those chip portions from the stresses developed by the later-applied plastic compound to form the package. In carrying out this aspect of the invention for any given IC chip, the first step preferably is to identify the stress-sensitive portions of the chip. This can initially be done analytically by design or product engineers familiar with the product who will be able based on their knowledge of the chip circuitry to predict the probable circuit elements which would be especially apt to cause significant variations in electrical performance in response to changes in applied stress. Such stress-sensitive elements may be particular transistors which play critical roles in determining the performance of the chip, and which can be affected by stresses applied to the transistors, e.g. to junctions thereof.

The so-identified stress-sensitive circuit portions then are delineated in a visual image to provide the assembly personnel with visual information to aid in carrying out the required processing prior to encapsulation. For this purpose, in one procedure employed with good success, an 8 x 10 color photograph is made of the chip circuit. A black and white photocopy then is made of the photograph, and the areas containing the stress-sensitive elements are marked, for example with a yellow marker. This yellow-marked copy becomes part of the production specifications, to show the assembly operator precisely where the protective isolating coating is to be applied to the chip.

This protective coating preferably is applied after the usual wire-bonding procedure has been carried out. In one example, the operator dispenses the coating material onto the preselected chip portions by means of a syringe, for example, a hypodermic needle, while observing the chip and the needle through a low-powered microscope. The operator positions the dispensing needle over the proper area of the die to be coated, using the yellow-marked photograph as a guide. The operator controls the flow of the coating material through the needle, as by means of manual or foot controls, to assure that the proper quantity is applied, i.e. sufficient to cover the entire area of the stress-sensitive elements, as marked on the photograph.

Figure 1:
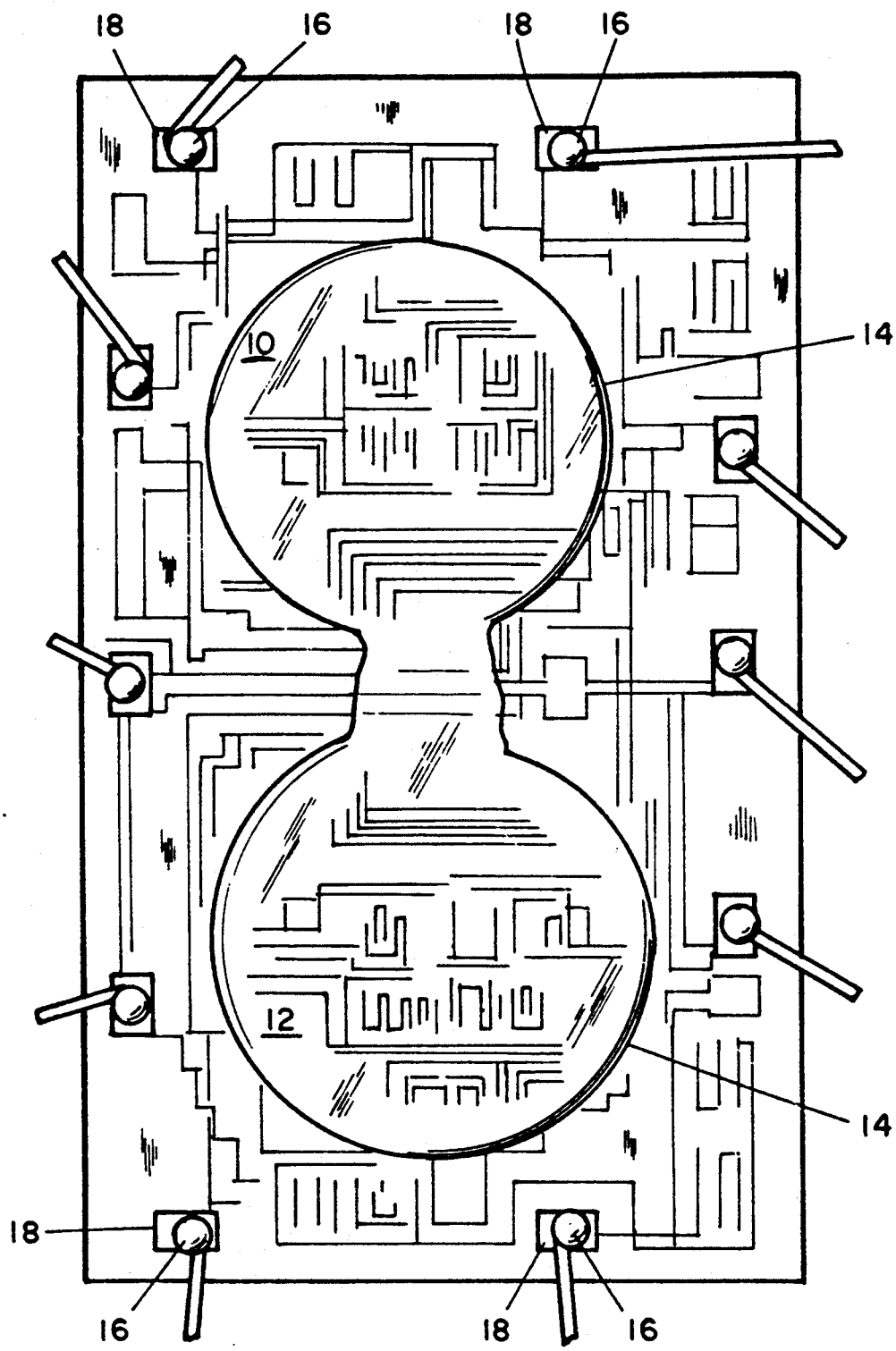
FIG. 1 is a plan view of a typical IC chip showing portions covered with a protective coating to reduce piezo-stresses.
Figure 2:
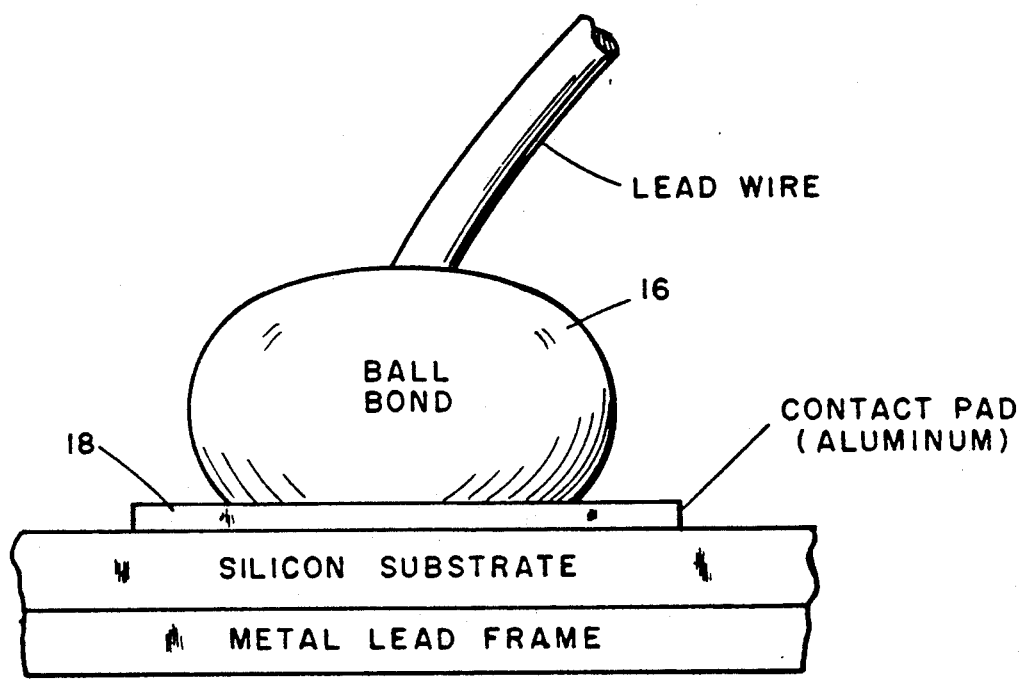
FIG. 2 is a detail elevation view particularly showing a wire-bond attached to a contact pad on the IC chip.

FIG. 1 shows an exemplary IC chip having two-stress-sensitive areas 10, 12 over which a protective coating has been applied, as indicated by the peripheral edges 14. The integrated circuit illustrated in FIG. 1 is a dual operational amplifier, and the stress-sensitive portions 10, 12 comprise JFETs in the input stage of the amplifier circuitry. The coating covers all of the input stage of each amplifier. However, it particularly is important to assure that the coating material does not run to the ball bonds 16 (see also FIG. 2). The finished coating preferably is spaced away from any ball bond by at least the width of one bond pad 18.

One material found to be especially suitable for this coating is siloxane polyimide, such as sold by M and T Chemicals, Inc. under the designation 2065-40. This material is provided in liquid form suspended in diglyme solvent, ready for dispensing. After application, it is cured to a hardened state, in intimate contact with the circuit elements of the chip.

The final coating can be quite thin without adversely affecting its efficacy. The coating thickness may be as small as tenths of a mil, or as thick as several mils, preferably less than the height of the ball bonds. Curing may be done in an air oven in a two-step process, the first step for ½ hour at 50° C., the second at 165° C. for one hour; or in a single step of 150° C for 1 hour.

Figure 3:
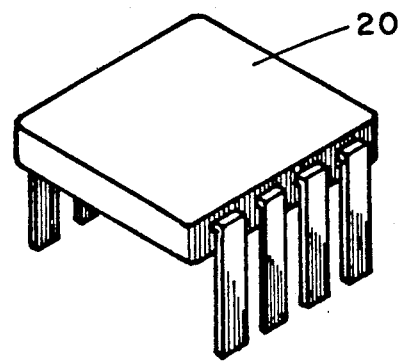
FIG. 3 is a perspective view showing a completed plastic-packaged IC chip.

After the coating 14 has been cured, the chip is packaged in plastic 20 in conventional fashion. FIG. 3 illustrates such a plastic packaged product, which may, for example, have an overall thickness of one-quarter inch or so.

The resulting product has surprisingly high manufacturing yields and excellent reliability in use. For example, with the particular IC operational amp shown in FIG. 1, high grade yields were boosted from the 30% range to close to 100%. Also, tests of 145 units through temperature cycling showed zero wire breaks through 3000 cycles of −65° to +150° C.

Circuit performance can be significantly improved in a statistical sense. For example, with the IC op amp circuit of FIG. 1, the offset voltage ($V_{OS}$) measurement for a group of parts all fall within a very tight spread, e.g. 98% have less than 0.5 mv offset, as compared to only about 30% within 0.5 mv when no protective coating is applied prior to encapsulation. Without the protective coating the part was commercially specified at 3 mv $V_{OS}$, but with the coating, it becomes possible to hold the tolerances sufficiently tightly to specify the part for commercial sale at 1 mv.

Still another benefit is that testing of the coated parts can be reduced substantially. Thus, with protective coating on the op amp shown in FIG. 1, testing would be at ambient only, with a sample tested at temperature different from ambient. This simplified test procedure can be used because of the very tight spread of the $V_{OS}$ distribution. Without the protective coating, all parts would be required to be 100% processed through ambient, temperature, and scanner drift testing, even for a part specified at 3 mv $V_{OS}$.

The polyimide coating material 14 described above has a coefficient of thermal expansion (CTE) of about 250–400 parts per million (per degree C), whereas the plastic encapsulating compound may have a CTE of about 26–30 ppm. Although such materials do work together quite well, as described above, there may be advantage in using a coating material which is more nearly matched in CTE to the encapsulating material.

Although in the preferred embodiment, the protective coating is maintained away from the ball bonds 16, it may in some applications be desirable to spread the coating around and into contact with the ball bond. However, in that case, care must be taken to assure that the layer of protective coating be extremely thin, e.g. less than the height of the ball bond, and preferably less than one-half that height.

In another embodiment of the invention, the protective coating is applied while the IC chips are in wafer form, i.e. before the wafer has been scored and split up into separate chips. In that case, the procedure is to spin coat the protective layer on the wafers, either before or after they have been trimmed. Thereafter, in an additional wafer processing step, the protective coating is etched out in the regions of the bond pads (including a marginal region around each bond pad to assure that the bonded wires are spaced away from the protective coating). The process then returns to the standard steps of separating the wafer into its component chips, followed by assembly and molding into plastic packages.

Although several embodiments of the invention have been described hereinabove in detail, it is to be understood that this is for the purpose of teaching the principles of the invention and should not be considered in a limiting sense, since the invention can be carried out in numerous forms in accordance with the requirements of particular applications.

What is claimed is:

1. In making plastic-encapsulated IC ships formed with an integrated circuit having stress-sensitive portions, the method of reducing stress-induced effects on the performance of the integrated circuit, comprising:
   forming the IC chip including wire-bond pads;
   applying over the stress-sensitive portions of the chip a coating of flowable insulating material while restricting the flow of the insulating material to provide an insulation free region around each of the wire-bond pads preventing contact between the insulation material and the pads;
   before or after said coating is applied, bonding wires to the bond pads; and
   encapsulating said coated chip in plastic.

2. The method of claim 1, wherein the wires are bonded to the bond pads prior to application of the coating.

3. The method of claim 2, including the steps of processing the coating to cause it to harden.

4. The method of claim 1, wherein the flowable material is a polyimide.

5. The method of claim 4, wherein the material is a polyimide which is cured in two steps at different temperatures.

6. The method of claim 1, wherein the flowable material is applied by a syringe.

7. In making plastic-encapsulated IC chips formed with an integrated circuit having stress-sensitive portions, the method of reducing stress-induced effects on the performance of the integrated circuit, comprising:
   forming the IC chip including wire-bond pads;
   bonding wires to the bond pads by forming ball bonds;
   then applying over the stress-sensitive portions of the chip a coating of flowable insulating material while allowing the insulating material to flow into contact with at least one of said pads;
   the thickness of said flowable material being controlled during application to be less than the height of the ball bond; and
   encapsulating said coated chip in plastic.

8. The method of claim 7, wherein the thickness of said material is controlled to be less than one-half the height of the ball bond.

9. In making plastic-encapsulated IC chips formed with an integrated circuit having stress-sensitive portions, the method of reducing stress-induced effects on the performance of the integrated circuit, comprising:
   forming a wafer with a plurality of IC chips including wire bond pads;
   applying over the wafer a coating of flowable insulating material;
   removing the flowable material from regions of said chips around said bonding pads so as to provide marginal insulation-free regions around each bond pad to laterally separate the wire-bond pads from the insulating material to assure that wires thereafter bonded to each pad are spaced away and thereby isolated from said insulating material;
   splitting said wafer into separate chips;
   bonding wires to the bond pads of said chips; and
   encapsulating said coated chips in plastic.

10. The method of claim 9, wherein the flowable insulating material is applied to the wafer by spin coating.

* * * * *